(12) United States Patent
Lee (10) Patent No.: US 12,255,177 B2
(45) Date of Patent: Mar. 18, 2025

(54) STACKED SEMICONDUCTOR DEVICE (71) Applicant: SK hynix Inc., Icheon-si (KR)

(72) Inventor: Yo Sep Lee, Icheon-si (KR)

(73) Assignee: SK hynix Inc., Incheon-si (KR)

( * ) Notice: Subject to any disclaimer, the term of this patent is extended or adjusted under 35 U.S.C. 154(b) by 282 days.

(21) Appl. No.: 17/548,186

(22) Filed: Dec. 10, 2021

(65) Prior Publication Data

US 2022/0375900 A1 Nov. 24, 2022

(30) Foreign Application Priority Data

May 18, 2021 (KR) .................. 10-2021-0063927

(51) Int. Cl.
*H01L 23/48* (2006.01)
*H01L 23/00* (2006.01)
*H01L 25/065* (2023.01)

(52) U.S. Cl.
CPC ........ *H01L 25/0657* (2013.01); *H01L 23/481* (2013.01); *H01L 24/08* (2013.01); *H01L 24/16* (2013.01); *H01L 24/48* (2013.01); *H01L 2224/08146* (2013.01); *H01L 2224/16146* (2013.01); *H01L 2224/48225* (2013.01); *H01L 2225/0651* (2013.01); *H01L 2225/06513* (2013.01); *H01L 2225/06541* (2013.01)

(58) Field of Classification Search
CPC ......... H01L 25/0657; H01L 2225/0651; H01L 2224/48227; H01L 2225/06541; H01L 2225/06506
See application file for complete search history.

(56) References Cited

U.S. PATENT DOCUMENTS

| | | | |
|---|---|---|---|
| 9,076,770 B2 | 7/2015 | Foster, Sr. et al. | |
| 9,767,061 B2 | 9/2017 | Kim | |
| 2008/0036082 A1* | 2/2008 | Eun | H01L 24/06 257/E21.597 |
| 2015/0113195 A1* | 4/2015 | Kim | G06F 13/4027 710/308 |
| 2017/0200698 A1* | 7/2017 | Graf | H01L 23/495 |
| 2020/0066640 A1* | 2/2020 | Sarkar | H01L 24/97 |
| 2020/0381399 A1* | 12/2020 | Choi | H01L 24/45 |
| 2020/0411636 A1* | 12/2020 | Kao | H01L 28/91 |
| 2021/0167017 A1* | 6/2021 | Eom | H01L 24/05 |

* cited by examiner

*Primary Examiner* — Kyoung Lee
*Assistant Examiner* — David J Goodwin
(74) *Attorney, Agent, or Firm* — WILLIAM PARK & ASSOCIATES LTD.

(57) ABSTRACT

A stacked semiconductor device includes a plurality of stacked semiconductor dies electrically connected with each other, a first power line electrically connected to a lowermost semiconductor die among the stacked semiconductor dies, a second power line formed over an uppermost semiconductor die among the stacked semiconductor dies, and an external connection line electrically connecting the first power line and the second power line.

20 Claims, 7 Drawing Sheets

STACKED SEMICONDUCTOR DEVICE

CROSS-REFERENCES TO RELATED APPLICATION

The present application claims priority under 35 U.S.C. § 119(a) to Korean application number 10-2021-0063927, filed on May 18, 2021, in the Korean Intellectual Property Office, which is incorporated herein by reference in its entirety.

BACKGROUND

1. Technical Field

Various embodiments may generally relate to a semiconductor device, and more particularly, to a stacked semiconductor device including vertically stacked semiconductor dies.

2. Related Art

As many modern electronic devices typically have multiple functions, high capacity, and a small form factor, a plurality of semiconductor dies may be integrated into a single package structure to form a semiconductor package capable of performing rapid operations, processing large amounts of data, and performing multiple functions. Further, the semiconductor dies may be vertically stacked using a through silicon via (TSV) to embody a massive capacity type memory device.

SUMMARY

In an example embodiment of the present disclosure, a stacked semiconductor device may include a plurality of stacked semiconductor dies, a first power line, a second power line, and an external connection line. The plurality of stacked semiconductor dies may be electrically connected with each other. The semiconductor dies may be vertically stacked. The first power line may be electrically connected to a lowermost semiconductor die among the stacked semiconductor dies. The second power line may be formed over an upper surface of an uppermost semiconductor die among the stacked semiconductor dies. The external connection line may electrically connect the first and second power lines.

In an example embodiment of the present disclosure, a stacked semiconductor device may include a plurality of stacked semiconductor dies, a first power line, a second power line, and an external connection line. The plurality of stacked semiconductor dies includes at least one through silicon via (TSV) and at least one interconnection. The stacked semiconductor dies may be electrically connected with each other through the at least one TSV and at least one interconnection. The first power line may be electrically connected to a lowermost semiconductor die among the stacked semiconductor dies. The second power line may be formed over an uppermost semiconductor die among the stacked semiconductor dies. The external connection line may be electrically connected to the first power line and the second power line.

In an example embodiment of the present disclosure, a stacked semiconductor device may include a plurality of stacked semiconductor dies, a first power line, a pad, a second power line, and an external connection line. The plurality of stacked semiconductor dies may include a plurality of TSVs electrically connecting the stacked semiconductor dies with each other. The first power line may be electrically connected to a lowermost semiconductor die among the stacked semiconductor dies. The pad may be formed in an upper surface of the lowermost semiconductor die to receive power from the first power line. The second power line may be formed over an uppermost semiconductor die among the plurality of stacked semiconductor dies. The external connection line may connect the pad with the second power line. The plurality of stacked semiconductor dies include dies having different sizes.

In an example embodiment of the present disclosure, a stacked semiconductor device may include a plurality of stacked semiconductor dies, a first power line, a pad, a second power line, and an external connection line. The plurality of stacked semiconductor dies may include a plurality of through silicon vias (TSVs) and the stacked semiconductor dies may be electrically connected with each other through the TSVs. The first power line may be connected to a lowermost semiconductor die among the plurality of stacked semiconductor dies. The second power line may be formed over a first surface of an uppermost semiconductor die among the plurality of stacked semiconductor dies. The pad may be formed in a second surface of the uppermost semiconductor die, and electrically connected to the second power line. The first surface of the uppermost semiconductor die may be opposite to the second surface of the uppermost semiconductor die. The external connection line may electrically connect the pad with the first power line. The uppermost semiconductor die has a size larger than a size of at least one of the semiconductor dies of the plurality of semiconductor dies stacked below the uppermost semiconductor die.

In an example embodiment of the present disclosure, a stacked semiconductor device may include a plurality of stacked semiconductor dies, a first power line, a second power line, a first pad, a second pad, and an external connection line. The plurality of stacked semiconductor dies may include a plurality of through silicon vias (TSVs). The stacked semiconductor dies may be electrically connected with each other through the TSVs. The first power line may be electrically connected to a lowermost semiconductor die among the plurality of stacked semiconductor dies. The first pad may be formed in the lowermost semiconductor die. The second power line may be formed over an uppermost semiconductor die among the plurality of stacked semiconductor dies. The second pad may be formed in the uppermost semiconductor die. The external connection line may electrically connect the first pad with the second pad. The uppermost semiconductor die and the lowermost semiconductor die have sizes larger than sizes of remaining semiconductor dies of the plurality of semiconductor dies stacked between the lowermost semiconductor die and the uppermost semiconductor die.

BRIEF DESCRIPTION OF THE DRAWINGS

The above and another aspects, features, and advantages of the subject matter of the present disclosure will be more clearly understood from the following detailed description taken in conjunction with the accompanying drawings, in which.

DETAILED DESCRIPTION

Various embodiments of the present teachings will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, possible embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments. However, embodiments of the present teachings should not be construed as limiting the inventive concept. Although a few embodiments of the present teachings will be shown and described, it will be appreciated by those of ordinary skill in the art that changes may be made in these embodiments without departing from the principles and spirit of the present teachings.

Figure 1:
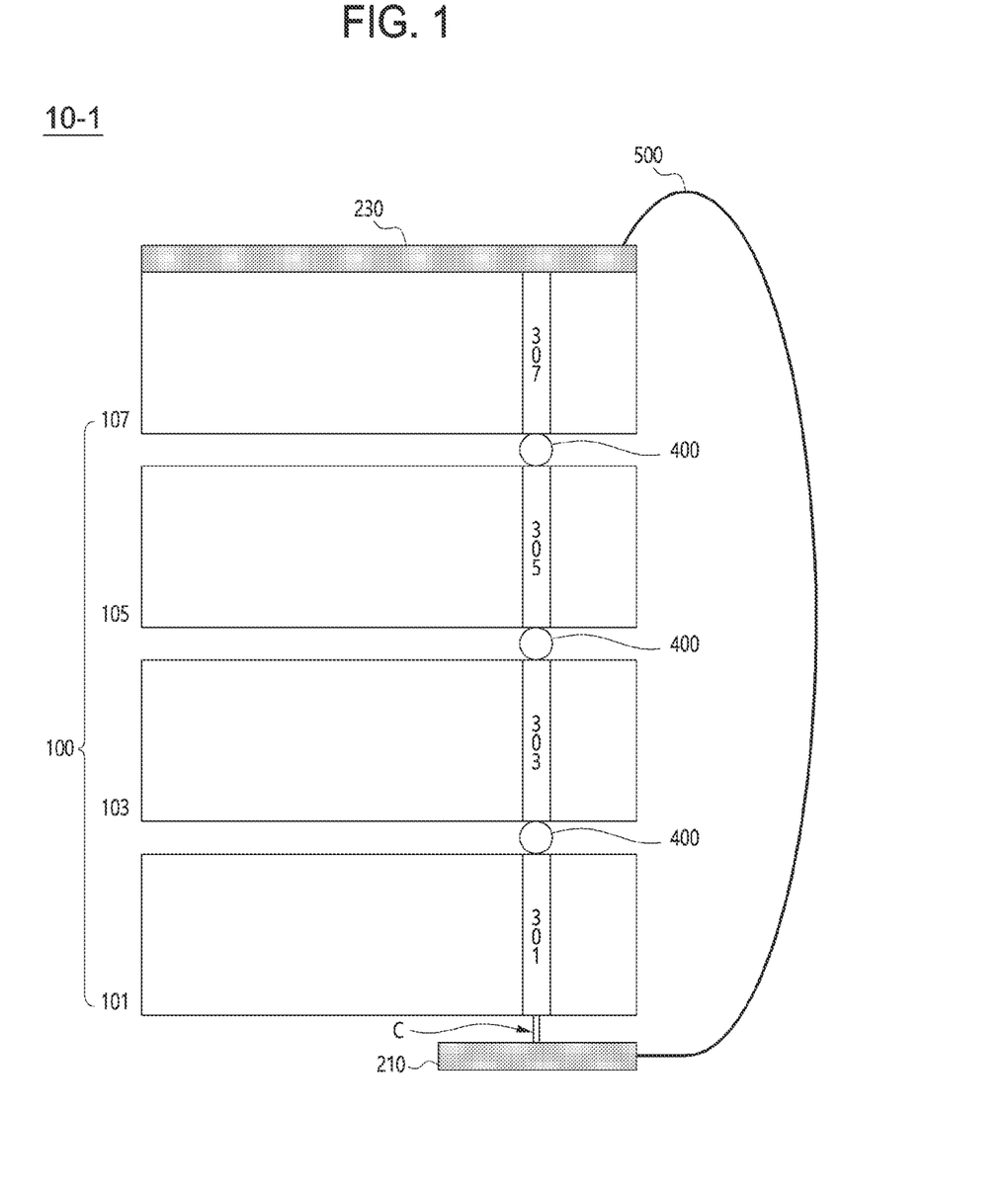
FIG. 1 is a cross-sectional view illustrating a stacked semiconductor device in accordance with an embodiment.
Figure 2:
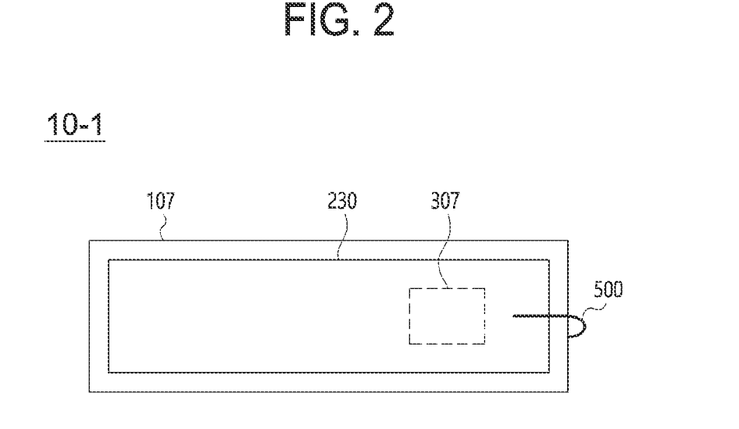
FIG. 2 is a plan view illustrating a stacked semiconductor device in accordance with an embodiment.

FIG. 1 is a cross-sectional view illustrating a stacked semiconductor device in accordance with an example embodiment, and FIG. 2 is a plan view illustrating a stacked semiconductor device in accordance with an example embodiment.

Referring to FIG. 1, a semiconductor device 10-1 may include a plurality of semiconductor dies 100 which are vertically stacked. Further, the semiconductor device 10-1 includes a plurality of through silicon vias (TSV) 301, 303, 305, 307, and a plurality of conductive bumps 400, to electrically couple the stacked semiconductor dies 100. The semiconductor device 10-1 further includes a first power line 210, a second power line 230, and an external connection line 500.

In example embodiments, a first semiconductor die 101 may be arranged on an upper surface of a substrate (not shown). A second semiconductor die 103 may be stacked on the first semiconductor die 101. A third semiconductor die 105, a fourth semiconductor die 107, a fifth semiconductor die (not shown), etc., may be sequentially stacked on the second semiconductor die 103. The number of stacked semiconductor dies 100 may be changed based on need.

For example, the first semiconductor die 101 may correspond to a lowermost semiconductor die among the stacked semiconductor dies 100. A circuit (not shown) for interfacing a memory controller with other semiconductor dies including the second semiconductor die 103, the third semiconductor die 105, and the fourth semiconductor die 107 may be formed in/on the first semiconductor die 101. The first semiconductor die 101 may include power management, memory management, etc., between the semiconductor dies 100, but is not limited thereto.

A TSV 301 (hereinafter, a first TSV) may be formed in the first semiconductor die 101 to penetrate the first semiconductor die 101. The first power line 210 may be arranged under the first semiconductor die 101. The first power line 210 may be connected to the first semiconductor die 101. The first semiconductor die 101 may receive power from the first power line 210 by a connection member C. For example, the first TSV 301 may be connected to the first power line 210 by the connection member C. The first semiconductor die 101 may share the power from the first power line 210 with the stacked semiconductor dies 103, 105, and 107.

The second semiconductor die 103 may be stacked on the first semiconductor die 101. The second semiconductor die 103 may include a TSV 303 (hereinafter, a second TSV). The second TSV 303 may correspond to the first TSV 301. The first TSV 301 may be electrically connected with the second TSV 303 via a conductive bump 400.

The third semiconductor die 105 and the fourth semiconductor die 107 may be electrically connected with the second semiconductor die 103 by the second TSV 303, a TSV 305 (hereinafter, third TSV) formed in the third semiconductor die 105, a TSV 307 (hereinafter, fourth TSV) formed in the fourth semiconductor die 107 and conductive bumps 400 between the TSVs. That is, the first to fourth TSVs 301, 303, 305, and 307 may be arranged to correspond to each other.

For example, an uppermost position of the stacked semiconductor device 10-1 may correspond to the fourth semiconductor die 107. The second power line 230 is arranged on an upper surface of the fourth semiconductor die 107. The second power line 230 may be configured to contact with the fourth TSV 307. The second power line 230 may have a shape configured to wholly cover the upper surface of the fourth semiconductor die 107, but is not limited thereto.

The first power line 210 and the second power line 230 may be electrically connected by the external connection line 500. For example, the external connection line 500 may include a wire.

The power may be directly supplied to the uppermost semiconductor die and the lowermost semiconductor die through the external connection line 500 so that the power may be relatively rapidly supplied to the semiconductor device 10-1 compared to when the power must be supplied to the uppermost semiconductor die through the lowermost and intermediate semiconductor dies.

Referring to FIG. 2, the fourth semiconductor die 107 corresponding to the uppermost semiconductor die may include the second power line 230. The second power line 230 may make contact with the fourth TSV 307. The external connection line 500 may be configured to connect the first power line 210 connected to the first semiconductor die 101 with the second power line 230 on the fourth semiconductor die 107.

Figure 3:
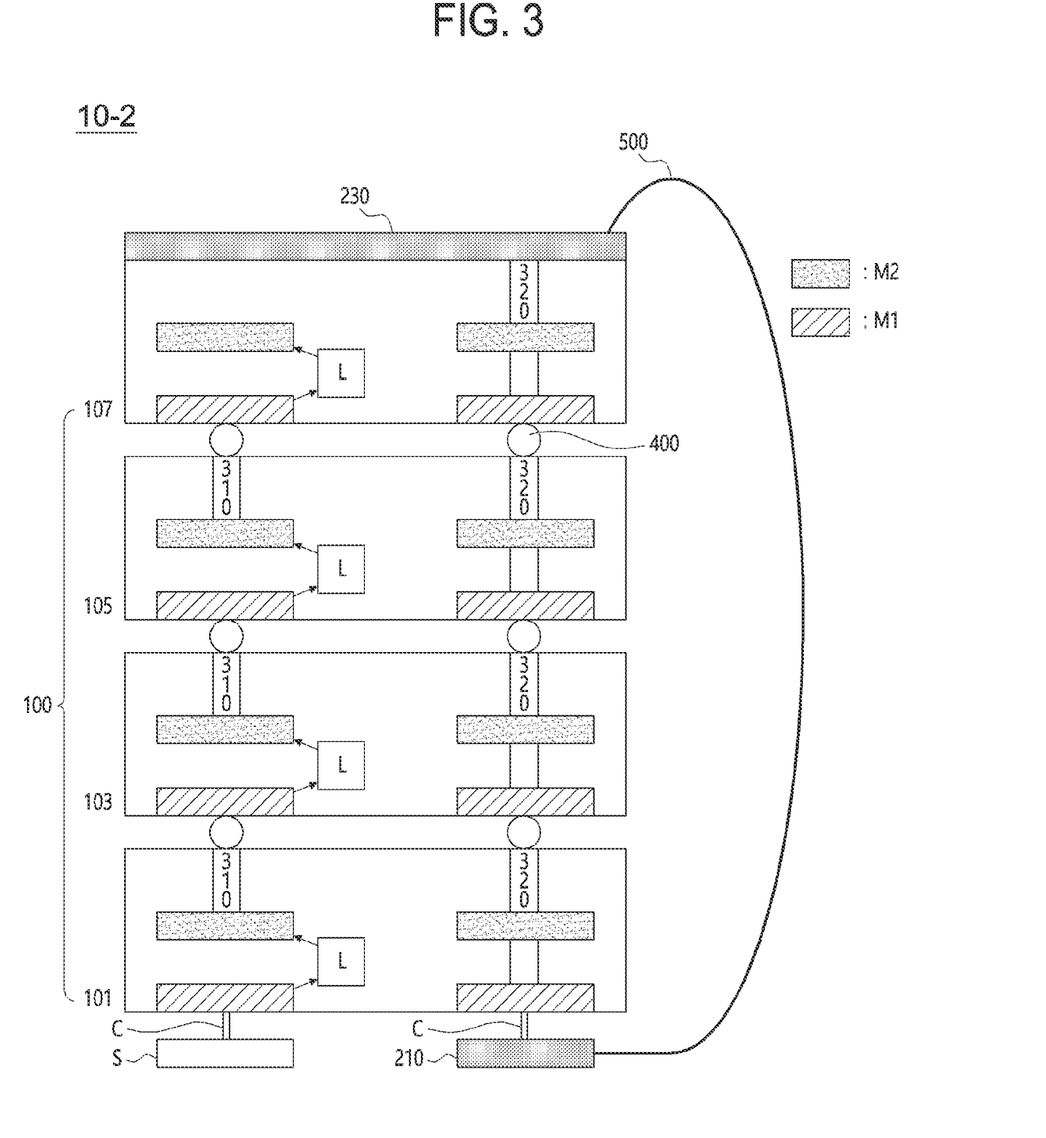
FIG. 3 is a cross-sectional view illustrating a stacked semiconductor device in accordance with an embodiment.

FIG. 3 is a cross-sectional view illustrating a stacked semiconductor device in accordance with an example embodiment.

Referring to FIG. 3, a stacked semiconductor device 10-2 may include a plurality of vertically stacked semiconductor dies 100 and TSVs 310 and 320. The TSVs 310 may be configured to connect the semiconductor dies 100 with signals. The TSVs 320 may be configured to connect the semiconductor dies 100 with power. The stacked semiconductor device 10-2 may include first interconnection layers M1 and second interconnection layers M2. The number of interconnection layers is not restricted to be equal to or less than any specific value. Connecting portions such as the first interconnection layer M1 and the second interconnection layer M2 may be located on at least one position in the TSVs 310 and 320. The connection portions may be electrically connected with each other via the TSV.

In order to transmit signals between the stacked semiconductor dies 100, each semiconductor die 100 may include a first interconnection layer M1, a second interconnection layer M2, a logic circuit L, and a TSV 310. The semiconductor dies 100 may be connected with each other via conductive bumps 400.

The first interconnection layers M1 and the second interconnection layers M2 may function as electrical connections. The first interconnection layers M1 in the semiconductor dies 100 may be positioned on a plane lower than a plane where the second interconnection layers M2 may be positioned. The first interconnection layers M1 and the second interconnection layers M2 may be distinguished from each other for description in accordance with their positions, a first interconnection layer being lower than a second interconnection layer within the same semiconductor die. This, however, need not always be the case. A first interconnection layer M1 may be connected with a lower semiconductor die through a conductive bump 400. The first interconnection layer M1 may be directly or indirectly connected to a second interconnection layer M2, The second interconnection layer M2 may make contact with one end of a TSV 310 so that the second interconnection layer M2 may be connected with an upper semiconductor die. The other end of the TSV 310 may be connected with the upper semiconductor die via a conductive bump 400. The semiconductor dies 100 having the above-indicated structure may be vertically stacked.

The logic circuit L may be arranged between the first interconnection layer M1 and the second interconnection layer M2. The logic circuit L may transmit and receive signals between the upper semiconductor die and the lower semiconductor die. The signal from the lower semiconductor die may be transmitted to the logic circuit L through the conductive bump 400 and the first interconnection layer M1. The logic circuit L may transmit the signal to the upper semiconductor die through the second interconnection layer M2, the TSV 310 and the conductive bump 400. The logic circuit L may receive a signal in a reverse order.

The first semiconductor die 101 corresponding to the lowermost semiconductor die in the stacked semiconductor dies 100 may be connected with a signal block S configured to transmit and receive signals. The fourth semiconductor die 107 corresponding to the uppermost semiconductor die in the stacked semiconductor dies 100 might not include the TSV 310 connected to the second interconnection layer M2.

In order to transmit power between the stacked semiconductor dies 100, the semiconductor dies 100 may include first interconnection layers M1, second interconnection layers M2, and the TSVs 320.

The first interconnection layer M1 in a semiconductor die 100 may be positioned on a plane lower than a plane where the second interconnection layer M2 may be positioned. The first interconnection layer M1 may be connected with a lower semiconductor die through the conductive bump 400. The first interconnection layer M1 may be connected with the second interconnection layer M2 of the lower semiconductor die through a TSV 320 of the lower semiconductor die. The second interconnection layer M2 may contact the conductive bump 400 so that the second interconnection layer M2 may be connected with an upper semiconductor die through the TSV 320.

The first semiconductor die 101 corresponding to the lowermost semiconductor die in the stacked semiconductor dies 100 may be electrically connected with the first power line 210. The first power line 210 may provide the power to the first semiconductor die 101. The fourth semiconductor die 107 corresponding to the uppermost semiconductor die in the stacked semiconductor dies 100 may include the second power line 230 arranged on the upper surface of the fourth semiconductor die 107. The second power line 230 may be formed in most regions of the upper portion of the fourth semiconductor die 107. The second power line 230 may be formed to contact the TSV 320 of the fourth semiconductor die 107. A shape and a size of the second power line 320 is not limited.

The external connection line 500 may be directly connected between the first power line 210, which may be connected to the first semiconductor die 101 corresponding to the lowermost semiconductor die, and the second power line 230 arranged on the upper surface of the fourth semiconductor die 107 corresponding to the uppermost semiconductor die. For example, the external connection line 500 may include a wire.

The power may be supplied from the lower semiconductor die to the upper semiconductor die through the conductive bumps 400, the first interconnection layers M1, the second interconnection layers M2 and the TSVs 320 formed on and/or under the second interconnection layers M2. Alternatively, the power may be transmitted through the TSVs 320, the second interconnection layers M2, the TSVs 320, and the first interconnection layers M1.

According to an example embodiment, the power may be directly supplied from the first semiconductor die 101 corresponding to the lowermost semiconductor die to the fourth semiconductor die 107 corresponding to the uppermost semiconductor die through the external connection line 500.

As the number of stacked semiconductor dies 100 increases, a delay in getting power to the upper semiconductor die may also increase. However, according to the example embodiment, the first power line 210 and the second power line 230 may be directly connected with each other through the external connection line 500 so that the power may be directly supplied to the uppermost semiconductor die. Thus, the power may be effectively and rapidly supplied to the uppermost semiconductor die in the stacked semiconductor device 10-2.

Figure 4:
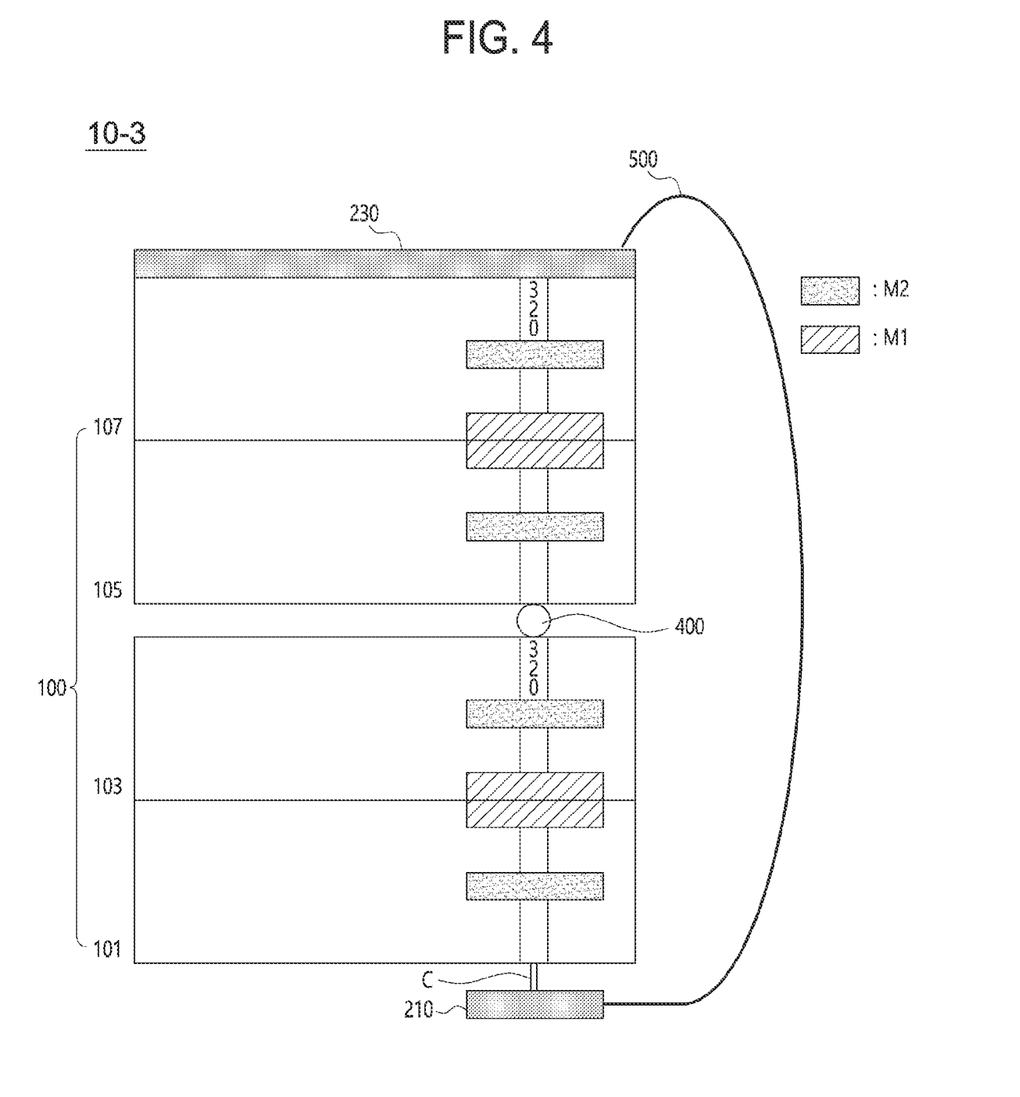
FIG. 4 is a cross-sectional view illustrating a connection of a stacked semiconductor device along a direction of a semiconductor die in accordance with an embodiment.

FIG. 4 is a cross-sectional view illustrating a connection of a stacked semiconductor device 10-3 along a direction of a semiconductor die in accordance with an example embodiment.

The stacked semiconductor device 10-3 may include a plurality of vertically stacked semiconductor dies 100. In detail, the stacked semiconductor device 10-3 includes a pair of flip chip bonding dies by connecting a conductive bump 400. An upper surface of a first semiconductor die 101 may be bonded to an upper surface of a semiconductor die 103 to contact the first interconnection line M1 of the first semiconductor die 101 and the first interconnection line M1 of the second semiconductor die 103, thereby forming a first pair of flip chip bonding dies 101 and 103. Likewise, an upper surface of a third semiconductor die 105 may be bonded to an upper surface of a semiconductor die 107 to contact the first interconnection line M1 of the third semiconductor die 105 and the first interconnection line M1 of the fourth semiconductor die 107, thereby forming a second pair of flip chip bonding dies 105 and 107.

The upper surface of the first semiconductor die 101 may be upwardly oriented. In contrast, the lower surface of the first semiconductor die 101 may be downwardly oriented. The second semiconductor die 103 may be vertically stacked on the first semiconductor die 101. The upper surface of the second semiconductor die 103 may be downwardly oriented. In contrast, the lower surface of the second semiconductor die 103 may be upwardly oriented. The first semiconductor die 101 may connect the second interconnection layer M2 through the first power line 210 and the TSV 320. The first interconnection layer M1 of the first semiconductor die 101 may make contact with the first interconnection layer M1 of the second semiconductor die 103 vertically stacked on the first semiconductor die 101. The first semiconductor die 101 and the second semiconductor die 103 may be bonded to each other by a direct bonding process without a conductive bump. Such a method may be referred to as the flip-chip bonding method. The first interconnection layer M1 of the first semiconductor die 101 may contact the first interconnection layer M1 of the second semiconductor die 103 so that the first semiconductor die 101 and the second semiconductor die 103 may electrically connect with each other.

The third semiconductor die 105 may be vertically stacked on the second semiconductor die 103. The lower surface of the third semiconductor die 105 may be downwardly oriented. In contrast, the upper surface of the third semiconductor die 105 may be upwardly oriented. Thus, the lower surface of the second semiconductor die 103 may face the lower surface of the third semiconductor die 105. The second semiconductor die 103 and the third semiconductor die 105 may be connected with each other through the conductive bump 400. The third semiconductor die 105 may be connected with the second semiconductor die 103 through the second interconnection layer M2, the TSV 320 and the conductive bump 400. The TSV 320 and the second interconnection layer M2 of the third semiconductor die 105 may be sequentially located.

The fourth semiconductor die 107 may be vertically stacked on the third semiconductor die 105. The upper surface of the fourth semiconductor die 107 may be downwardly oriented. In contrast, the lower surface of the fourth semiconductor die 107 may be upwardly oriented. The third semiconductor die 105 and the fourth semiconductor die 107 may be bonded to each other by a direct bonding process without a conductive bump.

The second power line 230 may be arranged on the upper surface of the fourth semiconductor die 107 corresponding to the uppermost semiconductor die in the stacked semiconductor device 10-3. The external connection line 500 may be connected between the second power line 230 on the upper surface of the fourth semiconductor die 107 and the first power line 210 on the lower surface of the first semiconductor die 101. Thus, the first power line 210 may be directly connected with the second power line 230 to rapidly supply the power to the upper semiconductor die in the stacked semiconductor device 10-3.

Connection structures between the semiconductor dies may be changed in accordance with directions of the upper surface and the lower surface in the semiconductor dies 100. When the semiconductor dies 100 may be directly bonded to each other without the conductive bump 400, a power supply length may be reduced by the conductive bump 400 to more rapidly supply the power to the semiconductor dies 100. Further, by directly bonding the semiconductor dies to each other, the number of conductive bumps 400 between the semiconductor dies 100 may be decreased to reduce a size of the stacked semiconductor device 10-3.

The directions in which the upper surfaces and the lower surfaces of the semiconductor dies 100 face is not limited to the arrangement shown in FIG. 4. The semiconductor dies 100 may be connected with each other by corresponding connection structures in accordance with the orientation of the semiconductor dies 100. When the upper surfaces of the adjacent semiconductor dies 100 may face to each other, the adjacent semiconductor dies 100 may be directly bonded to each other without the conductive bump 400. In contrast, the lower surfaces of the adjacent semiconductor dies 100 and the lower surface and the upper surface of the adjacent semiconductor dies 100 may face to each other, the adjacent semiconductor dies 100 may be connected with each other using the conductive bump 400. The arrangement of the stacked semiconductor device 10-3 is not be restricted to the above-described structure of FIG. 4.

Figure 5:
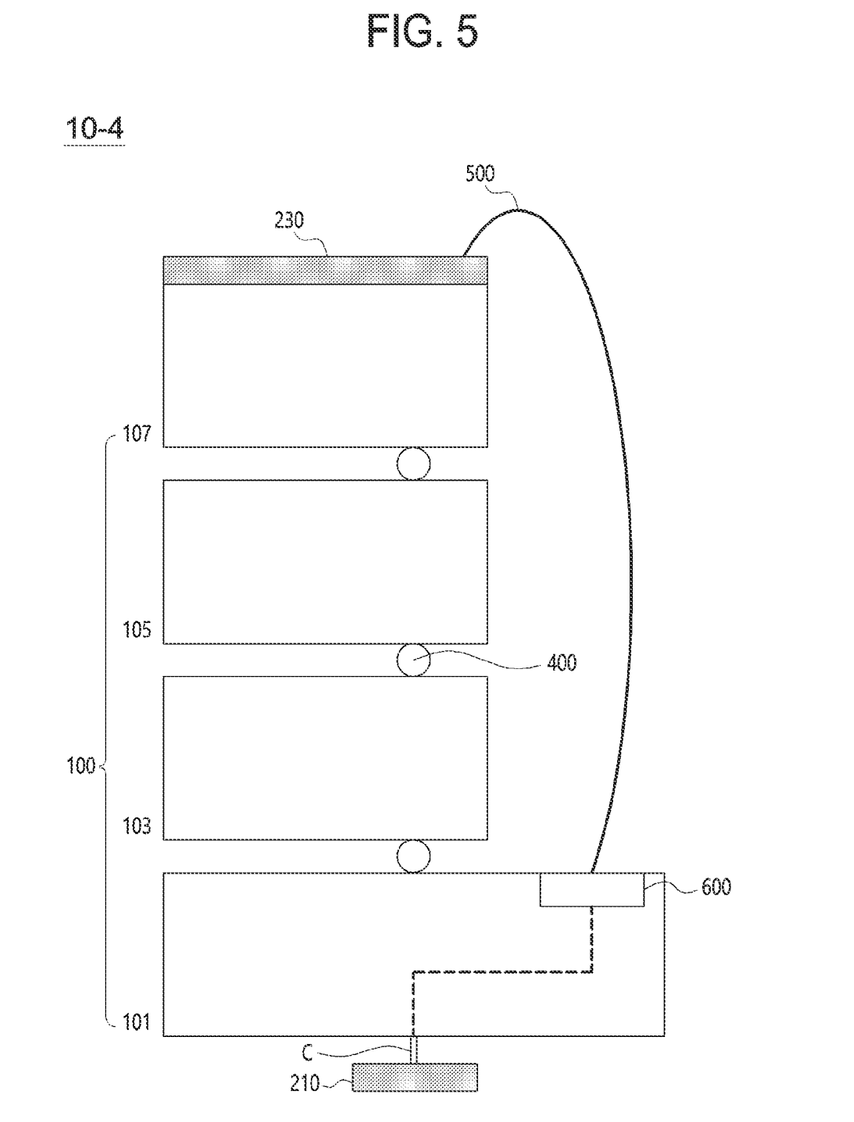
FIGS. 5 to 7 are cross-sectional views illustrating stacked semiconductor devices having different sizes in accordance with an embodiment.
Figure 6:
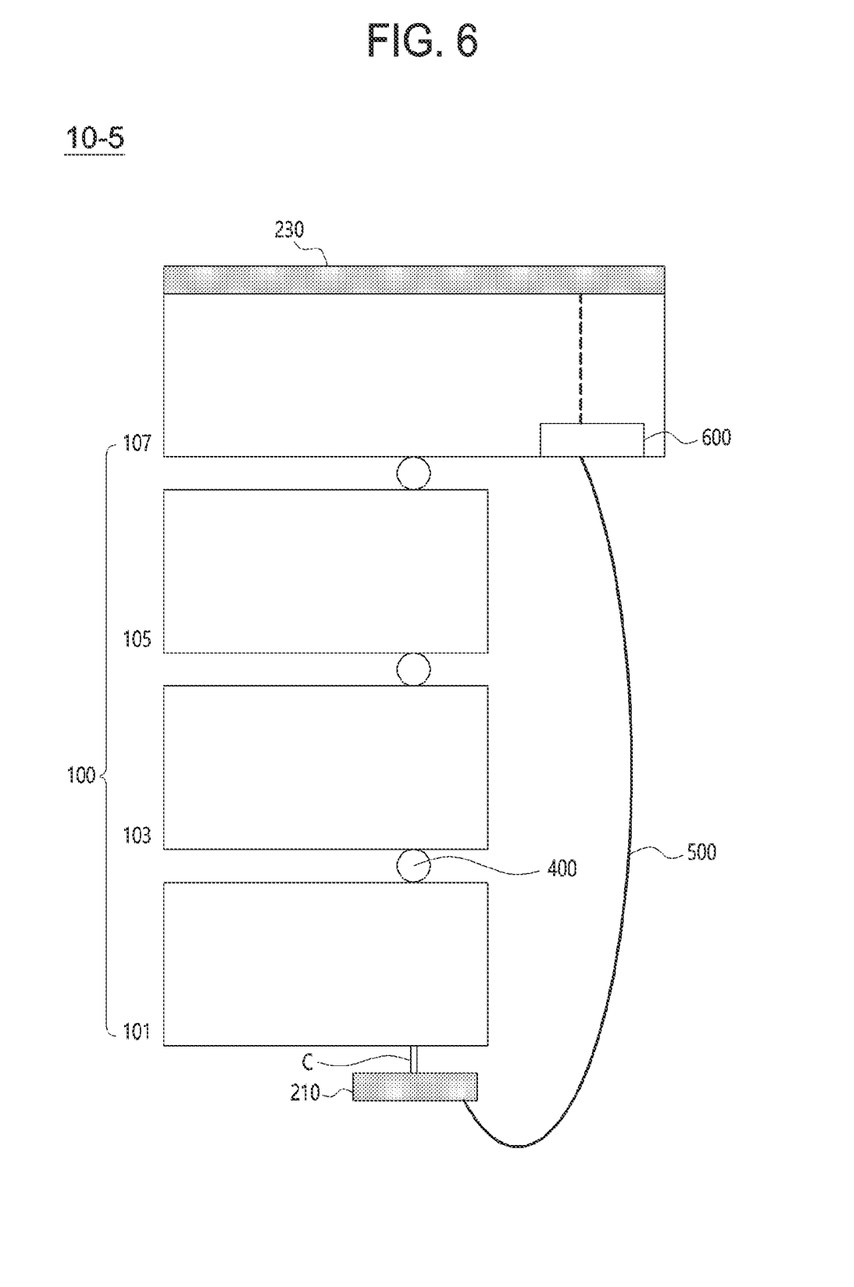
Figure 7:
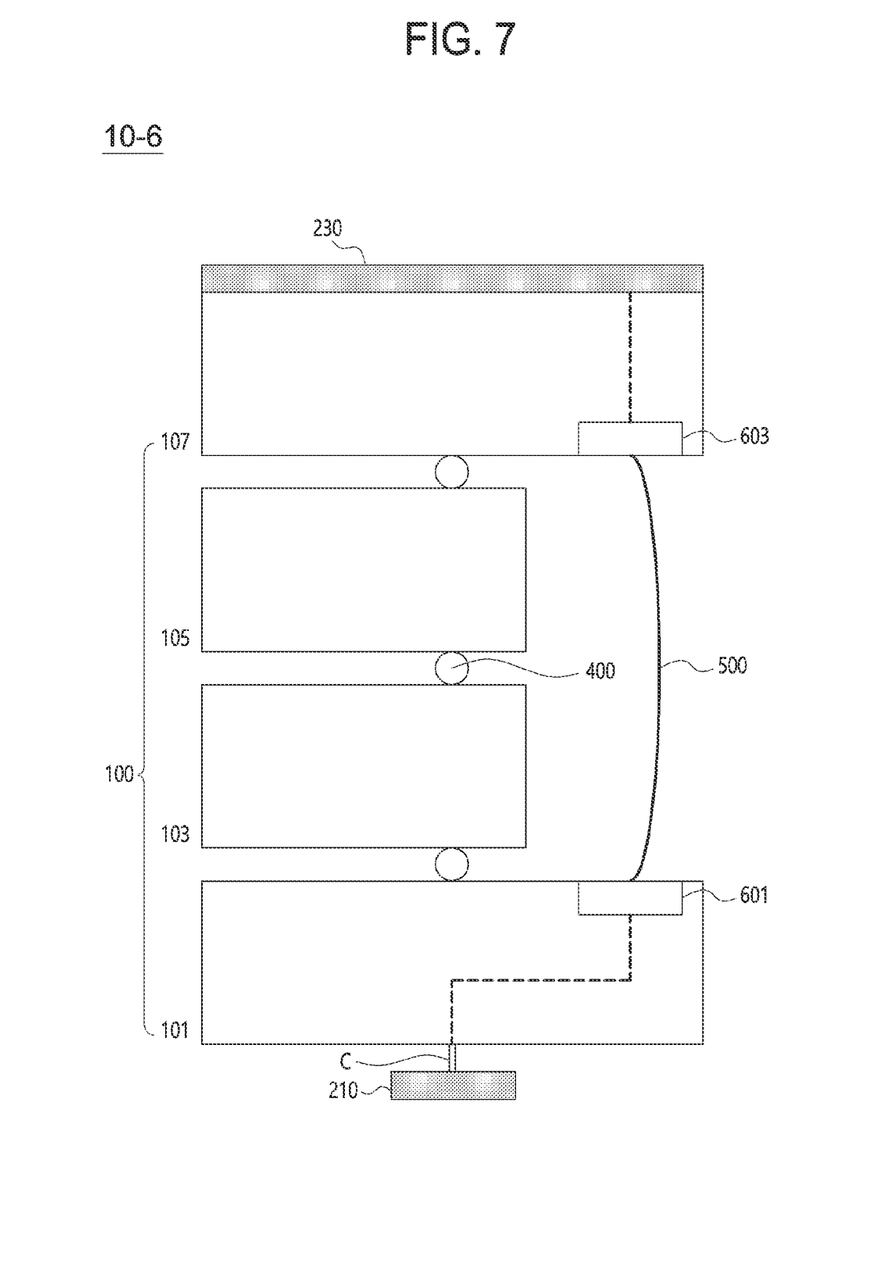

FIGS. 5 to 7 are cross-sectional views illustrating stacked semiconductor devices having different sizes in accordance with example embodiments.

Stacked semiconductor devices 10-4, 10-5, and 10-6 of example embodiments may include stacked semiconductor dies having different sizes.

Referring to FIG. 5, the first semiconductor die 101 corresponding to the lowermost semiconductor die in the stacked semiconductor device 10-4 may have a size larger than a size of other semiconductor dies 103, 105, and 107 stacked on the first semiconductor die 101.

The first semiconductor die 101 corresponding to the lowermost semiconductor die may be connected to the first power line 210. The fourth semiconductor die 107 corresponding to the uppermost semiconductor die may include the second power line 230. A pad 600 may be arranged on the upper surface of the first semiconductor die 101. The second to fourth semiconductor dies 103, 105, and 107 may be stacked on the first semiconductor die 101 so as to leave the pad 600 of the first semiconductor die 101 exposed. The pad 600 may be connected to the first power line 210. The pad 600 may be connected to the second power line 230 of the fourth semiconductor die 107, which may correspond to the uppermost semiconductor die in the stacked semiconductor device 10-4, through the external connection line 500.

The external connection line 500 may be located a range of the width of the first semiconductor die 101. The external connection line 500 may be connected between the pad 600 on the first semiconductor die 101 and the second power line 230.

Through this, the external connection line 500 connecting the first power line 210 and the second power line 230 is not located outside the width range of the first semiconductor die 101. Accordingly, the size of the stacked semiconductor device 10-4 including the semiconductor dies 100 having different sizes may be reduced.

Referring to FIG. 6, the fourth semiconductor die 107 corresponding to the uppermost semiconductor die in the stacked semiconductor device 10-5 may have a size larger than a size of other semiconductor dies 101, 103, and 105 stacked under the fourth semiconductor die 107.

The fourth semiconductor die 107 corresponding to the uppermost semiconductor die may include the second power line 230. The first semiconductor die 101 corresponding to the lowermost semiconductor die may be connected to the first power line 210. A pad 600 may be arranged on the lower surface of the fourth semiconductor die 107. The pad 600 may be positioned in a region of the fourth semiconductor die 107 so as not to overlap the third semiconductor die 105. The pad 600 may be connected to the second power line 230. The pad 600 may be connected to the first power line 210, which may be connected to the first semiconductor die 101 corresponding to the lowermost semiconductor die in the stacked semiconductor device 10-5, through the external connection line 500.

The external connection line 500 may be located a range of the width of the fourth semiconductor die 107. The external connection line 500 may be connected between the pad 600 under the fourth semiconductor die 107 and the first power line 210.

Through this, the external connection line 500 connecting the first power line 210 and the second power line 230 is not located outside the width range of the fourth semiconductor die 107. Accordingly, the size of the stacked semiconductor device 10-5 including the semiconductor dies 100 having different sizes may be reduced.

Referring to FIG. 7, the first semiconductor die 101 corresponding to the lowermost semiconductor die and the fourth semiconductor die 107 corresponding to the uppermost semiconductor die in the stacked semiconductor device 10-6 may have a size larger than a size of the second and third semiconductor dies 103 and 105.

The first semiconductor die 101 corresponding to the lowermost semiconductor die may be connected to the first power line 210. A first pad 601 may be arranged on the upper surface of the first semiconductor die 101.

The second semiconductor die 103 and the third semiconductor die 105 are stacked on the first semiconductor die 101 in such a way to leave the first pad 601 exposed. Although not shown in the FIG. 7, the first pad 601 may be electrically connected to the first power line 210 through a conductive interconnecting member, such as the TSVs 310 and/or 320, the first and second interconnection lines M1 and/or M2, which are formed in the first semiconductor die 101.

The fourth semiconductor die 107 corresponding to the uppermost semiconductor die may include a first surface and a second surface.

A second pad 603 may be formed on the first surface of the fourth semiconductor die 107. The second power line 230 may be formed on the second surface of the fourth semiconductor die 107. Although not shown in the FIG. 7, the second pad 603 may be electrically connected to the second power line 230 through a conductive interconnecting member, such as the TSVs 310 and/or 320, the first and second interconnection lines M1 and/or M2, which are formed in the fourth semiconductor die 107.

The fourth semiconductor die 107 may be stacked on the third semiconductor die 105. The fourth semiconductor die 107 may be stacked so that the second pad 603 of the fourth semiconductor die 107 and the first pad 601 of the first semiconductor die 101 face each other.

The first pad 601 of the first semiconductor die 101 and the second pad 603 of the fourth semiconductor die 107 may be connected with each other through the external connection line 500. The external connection line 500 is not located outside the width range of the first semiconductor die 101 or the fourth semiconductor die 107. The external connection line 500 may be located within the width range of the first semiconductor die 101 or the fourth semiconductor 107. Accordingly, the size of the stacked semiconductor device 10-6 including the semiconductor dies 100 having different sizes may be reduced.

Although not shown in the FIG. 7, the first power line 210 and the second power line 230 may be further connected by the external connection line 500 (refer to FIG. 1)

In example embodiments, the semiconductor dies 100 in the stacked semiconductor devices 10-4, 10-5, and 10-6 in FIGS. 5 to 7 may have uniform directions, but are not limited thereto. As indicated above with reference to FIG. 4, the directions of the semiconductor dies 100 may be differently arranged. The semiconductor dies 100 may be directly bonded to each other, or connected to each other using the conductive bump 400 in accordance with the directions of the semiconductor dies 100.

In example embodiments, each of the semiconductor dies 100 may include a power generator. The power generator may integrate the power supplied from the first power line 210 and the power supplied from the second power line 230 with each other to supply stable power to the semiconductor die. The power generator may supply the stable power supplied from the first power line 210 and the second power line 230 to the logic circuit L to transmit the signal.

Although not shown in the drawings, the plurality of stacked semiconductor dies 100 may be encapsulated by a mold structure to form a package.

According to example embodiments, the stacked semiconductor devices 10-1, 10-2, 10-3, 10-4, 10-5, and 10-6 may improve the problems of supplied power generated by numerous numbers of the semiconductor dies 100 in the stacked semiconductor devices 10-1, 10-2, 10-3, 10-4, 10-5 and 10-6.

Stacked semiconductor devices may further include the second power line 230. The second power line 230 may be directly connected between the external connection line and the uppermost semiconductor die having the weakness of the power supply to rapidly supply the power to the semiconductor dies. Further, when the semiconductor dies have different sizes, the pad may be formed at the upper surface or the lower surface of the semiconductor the having the large size. Thus, the first power line and the second power line may be directly connected with each other to prevent the size of the stacked semiconductor device from being enlarged.

The above described embodiments of the present teachings are intended to illustrate and not to limit the present teachings. Various alternatives and equivalents are possible. The present teachings are not limited by the embodiments described herein. Nor are the present teachings limited to any specific type of semiconductor device. Additions, subtractions, or modifications are possible in view of the present disclosure and are intended to fall within the scope of the appended claims.

What is claimed is:

1. A stacked semiconductor device comprising:
a plurality of stacked semiconductor dies including a lowermost semiconductor die, an uppermost semiconductor die and intermediate semiconductor dies located between the lowermost semiconductor die and the uppermost semiconductor die;
a first power line arranged under the lowermost semiconductor die and electrically connected to the lowermost semiconductor die;
a second power line arranged on an upper surface of the uppermost semiconductor die and electrically connected to the uppermost semiconductor die; and
an external connection line electrically and directly connecting the first power line and the second power line so that power supplied to the lowermost semiconductor die through the first power line is directly supplied to the uppermost semiconductor die without passing through the intermediate semiconductor dies.

2. The stacked semiconductor device of claim 1, wherein each of the plurality of stacked semiconductor dies includes at least one through silicon via (TSV).

3. The stacked semiconductor device of claim 2, wherein the first power line is electrically connected to a TSV included in the lowermost semiconductor die by a connection member.

4. The stacked semiconductor device of claim 2, wherein the second power line is contacted with a TSV included in the uppermost semiconductor die.

5. The stacked semiconductor device of claim 2, further comprising:
a plurality of conductive bumps disposed between TSVs included in each of the plurality of stacked semiconductor dies.

6. The stacked semiconductor device of claim 1, wherein the external connection line comprises an electrically conductive wire.

7. The stacked semiconductor device of claim 1, wherein each of the plurality of stacked semiconductor dies includes at least one through silicon via (TSV) and at least one interconnection layer.

8. The stacked semiconductor device of claim 7, further comprising: conductive bumps disposed between the at least one TSV and the at least one interconnection layer to electrically connect the plurality of stacked semiconductor dies with each other.

9. The stacked semiconductor device of claim 7, wherein at least two semiconductor dies of the plurality of stacked semiconductor dies are bonded to each other by a direct bonding process without a conductive bump, and
wherein interconnection layers in the at least two semiconductor dies are contacted with each other.

10. A stacked semiconductor device comprising:
a plurality of stacked semiconductor dies including a lowermost semiconductor die, an uppermost semiconductor die and intermediate semiconductor dies located between the lowermost semiconductor die and the uppermost semiconductor die;
a first power line arranged under the lowermost semiconductor die and electrically connected to the lowermost semiconductor die;
a second power line arranged on an upper surface of the uppermost semiconductor die and electrically connected to the uppermost semiconductor die;
a pad formed in at least one of the lowermost semiconductor die and the uppermost semiconductor die; and
an external connection line electrically and directly connecting the pad with at least one of the first power line and the second power line so that power supplied to the lowermost semiconductor die through the first power line is directly supplied to the uppermost semiconductor die without passing through the intermediate semiconductor dies.

11. The stacked semiconductor device of claim 10, wherein the lowermost semiconductor die has a size larger than sizes of the intermediate semiconductor dies and the uppermost semiconductor die,
wherein the pad is formed on an upper surface of the lowermost semiconductor die, and
wherein the external connection line connects the pad with the second power line.

12. The stacked semiconductor device of claim 11, wherein the external connection line comprises an electrically conductive wire; and
wherein the external connection line is located within a range of a width of the lowest semiconductor die.

13. The stacked semiconductor device of claim 10, wherein the uppermost semiconductor die has a size larger than sizes of the intermediate semiconductor dies and the lowermost semiconductor die,
wherein the pad is formed on a lower surface of the uppermost semiconductor die, and
wherein the external connection line connects the pad with the first power line.

14. The stacked semiconductor device of claim 13, wherein the external connection line comprises an electrically conductive wire; and
wherein the external connection line is located within a range of a width of the uppermost semiconductor die.

15. The stacked semiconductor device of claim 10, wherein the plurality of stacked semiconductor dies are electrically connected with each other through conductive bumps.

16. The stacked semiconductor device of claim 10, wherein the pad is connected to at least one of the first power line and the second power line.

17. A stacked semiconductor device comprising:
a plurality of stacked semiconductor dies including a lowermost semiconductor die, an uppermost semiconductor die and intermediate semiconductor dies located between the lowermost semiconductor die and the uppermost semiconductor die;
a first power line arranged under the lowermost semiconductor die and electrically connected to the lowermost semiconductor die;
a first pad formed on an upper surface of the lowermost semiconductor die and electrically connected to the first power line;
a second power line arranged on an upper surface of the uppermost semiconductor die and electrically connected to the uppermost semiconductor die;
a second pad formed on a lower surface of the uppermost semiconductor die and electrically connected to the second power line; and
an external connection line electrically and directly connecting the first pad with the second pad so that power supplied to the lowermost semiconductor die through the first power line is directly supplied to the uppermost semiconductor die without passing through the intermediate semiconductor dies.

18. The stacked semiconductor device of claim 17, wherein the uppermost semiconductor die and the lowermost semiconductor die have sizes larger than sizes of the intermediate semiconductor dies.

19. The stacked semiconductor device of claim 17, wherein the first pad of the lowermost semiconductor die and the second pad of the uppermost semiconductor die face each other.

20. The stacked semiconductor device of claim 17, wherein the external connection line comprises an electrically conductive wire; and
wherein the external connection line is positioned within a range of the sizes of the lowermost and the uppermost semiconductor die.

* * * * *